(12) United States Patent
Beck et al.

(10) Patent No.: US 9,945,923 B2
(45) Date of Patent: Apr. 17, 2018

(54) METHOD AND APPARATUS FOR PROSPECTIVE MOTION CORRECTION USING VOLUME NAVIGATORS IN MAGNETIC RESONANCE IMAGING

(71) Applicant: Siemens Healthcare GmbH, Erlangen (DE)

(72) Inventors: Thomas Beck, Erlangen (DE); Himanshu Bhat, Cambridge, MA (US)

(73) Assignee: Siemens Aktiengesellschaft, Munich (DE)

(*) Notice: Subject to any disclaimer, the term of this patent is extended or adjusted under 35 U.S.C. 154(b) by 433 days.

(21) Appl. No.: 14/819,709

(22) Filed: Aug. 6, 2015

(65) Prior Publication Data
US 2017/0038448 A1    Feb. 9, 2017

(51) Int. Cl.
*G01R 33/565*    (2006.01)
*G01R 33/483*    (2006.01)

(52) U.S. Cl.
CPC ... *G01R 33/56509* (2013.01); *G01R 33/4835* (2013.01)

(58) Field of Classification Search
CPC .............. G01R 33/56509; G01R 33/4835
See application file for complete search history.

(56) References Cited

U.S. PATENT DOCUMENTS

| | | | |
|---|---|---|---|
| 7,432,706 B2 * | 10/2008 | van der Kouwe | G01R 33/4806 324/306 |
| 2008/0004518 A1 * | 1/2008 | Stehning | G01R 33/50 600/410 |
| 2013/0187649 A1 | 7/2013 | Bhat et al. | |
| 2014/0210469 A1 | 7/2014 | Cheng et al. | |
| 2014/0296702 A1 * | 10/2014 | Griswold | G01R 33/3614 600/416 |
| 2015/0042332 A1 | 2/2015 | Lin | |

(Continued)

OTHER PUBLICATIONS

Tisdall, et al., "MPRAGE using EPI navigators for prospective motion correction." Proceedings of the 17th annual meeting of International Society of Magnetic Resonance in Medicine. 2009, p. 4656.

(Continued)

*Primary Examiner* — Gregory H Curran
(74) *Attorney, Agent, or Firm* — Schiff Hardin LLP

(57) ABSTRACT

In a method and apparatus for motion-corrected magnetic resonance (MR) imaging, MR data are acquired in a diagnostic scan in respective portions, and between each portion of acquired diagnostic data, a navigator scan is implemented wherein navigator data are acquired simultaneously in multiple slices in a navigator sub-volume that is less than the volume of the acquisition volume. A reference scan is acquired before beginning the diagnostic scan, and the navigator data in the sub-volumes are acquired between the acquisition of the portions of the MR data in the diagnostic scan. Between each acquisition portion, a motion-correction algorithm is executed, wherein the navigator data of the sub-volume is compared only to corresponding image data in the reference scan, and, if necessary, a motion-correction instruction is generated that is used for the acquisition of the next diagnostic data portion.

17 Claims, 4 Drawing Sheets

(56) References Cited

U.S. PATENT DOCUMENTS

2015/0084629 A1    3/2015  Porter

OTHER PUBLICATIONS

Thesen, et al. "Prospective acquisition correction for head motion with image-based tracking for real-time fMRI." Magnetic Resonance in Medicine 44.3 (2000) pp. 457-465.
Thesen, "Retrospektive and prospektive Verfahren zur bildbasierten Korrektur von Patientenkopfbewegungen bei neurofunktioneller Magnetresonanztomographie in Echtzeit." (2001), Dissertation at Ruprecht Karls Universität, Heidelberg, Germany.
Shankaranarayanan et al. "Motion insensitive 3D imaging using a novel real-time image-based 3D PROspective MOtion correction method (3D PROMO)." *ISMRM 15th Scientific Meeting*. 2007, p. 2117.
Maclaren et al. Prospective motion correction in brain imaging: a review. "Magnetic Resonance in Medicine", vol. 69, No. 3 (2013) pp. 621-636.
Setsompop et al. Blipped-controlled aliasing in parallel imaging for simultaneous multislice echo planar imaging with reduced g-factor penalty. Magnetic Resonance in Medicine, vol. 67 No. 5 (2012), pp. 1210-1224.

* cited by examiner

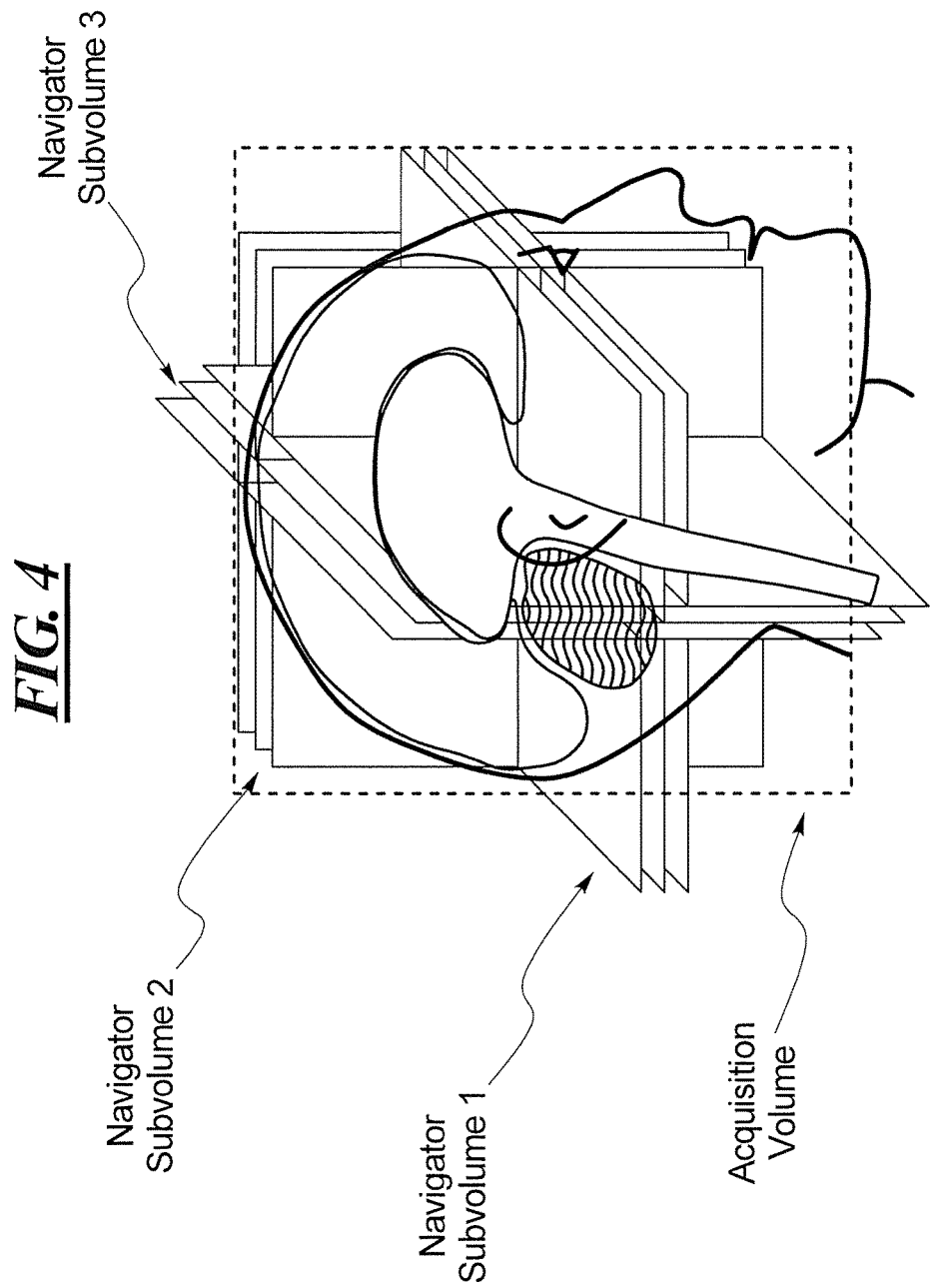

METHOD AND APPARATUS FOR PROSPECTIVE MOTION CORRECTION USING VOLUME NAVIGATORS IN MAGNETIC RESONANCE IMAGING

BACKGROUND OF THE INVENTION

Field of the Invention

The present invention concerns a method and an apparatus for implementing motion correction in magnetic resonance imaging. The invention more specifically concerns implementing such motion correction using volume navigators.

Description of the Prior Art

Navigator-based prospective motion correction methods are known that compensate patient motion during the acquisition of magnetic resonance (MR) image data. Unlike retrospective methods, in such prospective methods motion is detected and compensated during the measurement (image data acquisition) in real-time. The detection of the patient motion can be achieved by the use of navigators, which are activated during dead times of the image acquisition sequence that is used to operate the MR scanner.

An example of a known prospective motion-correction method is described in the article by Tisdall et al. entitled "MPRAGE Using EPI Navigators For Prospective Motion Correction," Proceedings of the 17th Annual Meeting of International Society of Magnetic Resonance in Medicine 2009. In this procedure, low resolution 3D EPI navigator volumes are acquired with a base resolution of 32×32×32. The data for such navigator volumes can be acquired within 500 ms. Each data acquisition sequence that has a sufficiently long dead time can be equipped with such navigators, in order to support real-time motion compensation.

In practice, navigator images are reconstructed for navigator data acquired at a point in time $t=t_1$, and an image based, six-degree-of-freedom rigid-body registration to a reference volume is then done. Typically, the reference volume is acquired before the acquisition of the motion-corrected sequence begins (at a point in time $t=0$). The detected motion parameters are fed back to the control computer that formulates the sequence for operating the MR scanner, and the control computer automatically adapts the imaging field-of-view (FOV) to compensate for the detected motion at time $t_1$. Motion which may occur between $t_1$ and the partial acquisition of the image data in the motion-compensated sequence is not considered. As a result, the actual motion-compensation lags slightly behind the data acquisition, and cannot correct for all motion. Slowly occurring motion drifts, however, can be compensated very well.

To enable real-time motion correction, the motion detection module of the processor must be able to provide motion estimates very quickly. Therefore, a rigid body model assumption with six-degrees-of-freedom (three translational and three rotational) is sometimes generated. For MR data acquisitions from the head of a subject, this model assumption is reasonable. The aforementioned task of registering low resolution EPI image data matches the requirements for motional correction in functional magnetic resonance imaging (fMRI). Methods of this type have been proposed for high performance rigid-body motion detection and prospective correction of fMRI data, as described in Thesen et al. "Prospective Acquisition Correction for Head Motion with Image-Based Tracking for Real-Time fMRI," Magnetic Resonance in Medicine, Volume 44, Number 3 (2000) pages 457-465 and in the inaugural dissertation of Stefan Thesen at Ruprecht-Karls-Universitat Heidelberg entitled "Retrospektive und prospektive Verfahren zur bildbasierten Korrektur von Patientenkopfbewegungen bei neurofunktioneller Magnetresonanztomographie in Echtzeit," ("Retrospective and Prospective Methods for Image-Based Correction of Patient Head Motions in Neuro-Functional Magnetic Resonance Tomography in Real-Time").

The same strategy described above, but without the use of additional dedicated navigator volumes, forms the basis of the commercially available operating sequence ep2d_pace (Siemens Healthcare). Instead of an additional navigator volume, the entire ep2d volume is considered for motion detection. The volume at time $t=t_i$ is reconstructed and brought into registration with the reference obtained at $t=t_0$ during the acquisition at time $t=t_{i+1}$, and is compensated at time $t=t_{i+2}$. Therefore, the motion compensation lags by at least one repetition (TR) of the sequence during the acquisition of image data.

Conventional 3D image-based navigator methods make use of navigator volumes (i.e., the volume of the subject from which the navigator data are acquired) that are congruent with the imaging volume of the motion-compensated sequence in which the navigator signals are used. This has the advantage that the detected motion parameters can be sent directly back to the computer that is controlling the operation of the MR scanner to execute the imaging sequence, in order to implement motion compensation in the sequence.

In the article by Shankaranarayanan et al. entitled "Motion insensitive 3D imaging using a novel real-time image-based 3D PROspective MOtion correction method (3D PROMO)," ISMRM 15th Scientific Meeting (2007), a navigator based solution is described called 3D promo, which is also based on prospective rigid-body motion. This article notes that there are problematic regions that do not satisfy the model assumption of rigid-body motion. In the brain, these regions are primarily located in the neck, jaw, and next to the nasal cavities and sinuses. In order to improve the motion estimation and to minimize the influence of non-linear effects, the authors of this article propose to apply an extended Kalman filter to the navigator data.

An overview of prospective motion correction strategies can be found in the article by Maclaren et al. entitled "Prospective motion correction in brain imaging: a review," Magnetic Resonance in Medicine, Volume 69, Number 3 (2013), pages 621-636.

SUMMARY OF THE INVENTION

In accordance with the present invention, in a method for prospective motion correction using multiple image-based volume navigators, multiple sub-volume navigator slices are simultaneously obtained, that collectively have a total volume that is less than the acquisition volume from which diagnostic data are acquired in the motion-compensated sequence. Each navigator sub-volume can consist of only one slice, or multiple slices, such as three slices per sub-volume. The sub-volumes can be orthogonal to each other, for example.

The multiple slices of the sub-volume navigators can be acquired with a simultaneous multi-slice (SMS) blipped CAIPI acceleration method, as described in Setsompop et al., "Blipped-controlled aliasing in parallel imaging for simultaneous multislice echo planar imaging with reduced g-factor penalty," Magnetic Resonance in Medicine, Volume 67, Number 5 (2012) pages 1210-1224.

In the embodiment wherein the navigator sub-volumes are orthogonal slices, the intersection of the orthogonal slices may coincide with the center of the acquisition volume (i.e., the center of the field of view (FOV) of the data acquisition sequence), but this need not necessarily be the case.

As is typical, the navigator signals (slices) are acquired with a lower resolution than the diagnostic image data. In a further embodiment, before beginning the motion-corrected data acquisition sequence, a localizer image of the subject can be acquired, which provides an overview of the relevant anatomy of the subject. Such a localizer image is often acquired to support planning of the acquisition field of view. This localizer image can be processed automatically by known methods to detect the anatomy therein and to calculate the position of anatomical landmarks, without user interaction. This anatomical information can be used to also provide useful background information for the definition of the sub-volume navigator positioning and coverage. It is desirable to plan the location of each sub-volume navigator so as to be in, or encompass, an anatomical region that cannot be moved non-rigidly by the patient. Therefore, anatomical regions that are susceptible to image artifacts, such as the neck region, jaw region, and regions next to the nasal cavities and sinuses, should be avoided for placement of the navigator sub-volumes. Regions from which navigator data can be acquired reliably and with minimal risk to such image artifacts are preferred. Although user interaction with the localizer image, via a user interface, can be implemented in order to define the navigator positioning, a fully automatic placement of the sub-volume navigators is preferable.

The present invention also encompasses a magnetic resonance imaging apparatus constructed and operated so as to implement the method according to the invention as described above.

The present invention also encompasses a non-transitory, computer-readable data storage medium encoded with programming instructions that, when loaded into a control computer of a magnetic resonance imaging apparatus, cause the control computer to operate the magnetic resonance imaging apparatus to implement the method according to the invention as described above.

BRIEF DESCRIPTION OF THE DRAWINGS

FIG. 4 schematically illustrates a second embodiment for defining the navigator sub-volumes in accordance with the present invention.

DESCRIPTION OF THE PREFERRED EMBODIMENTS

Figure 1:
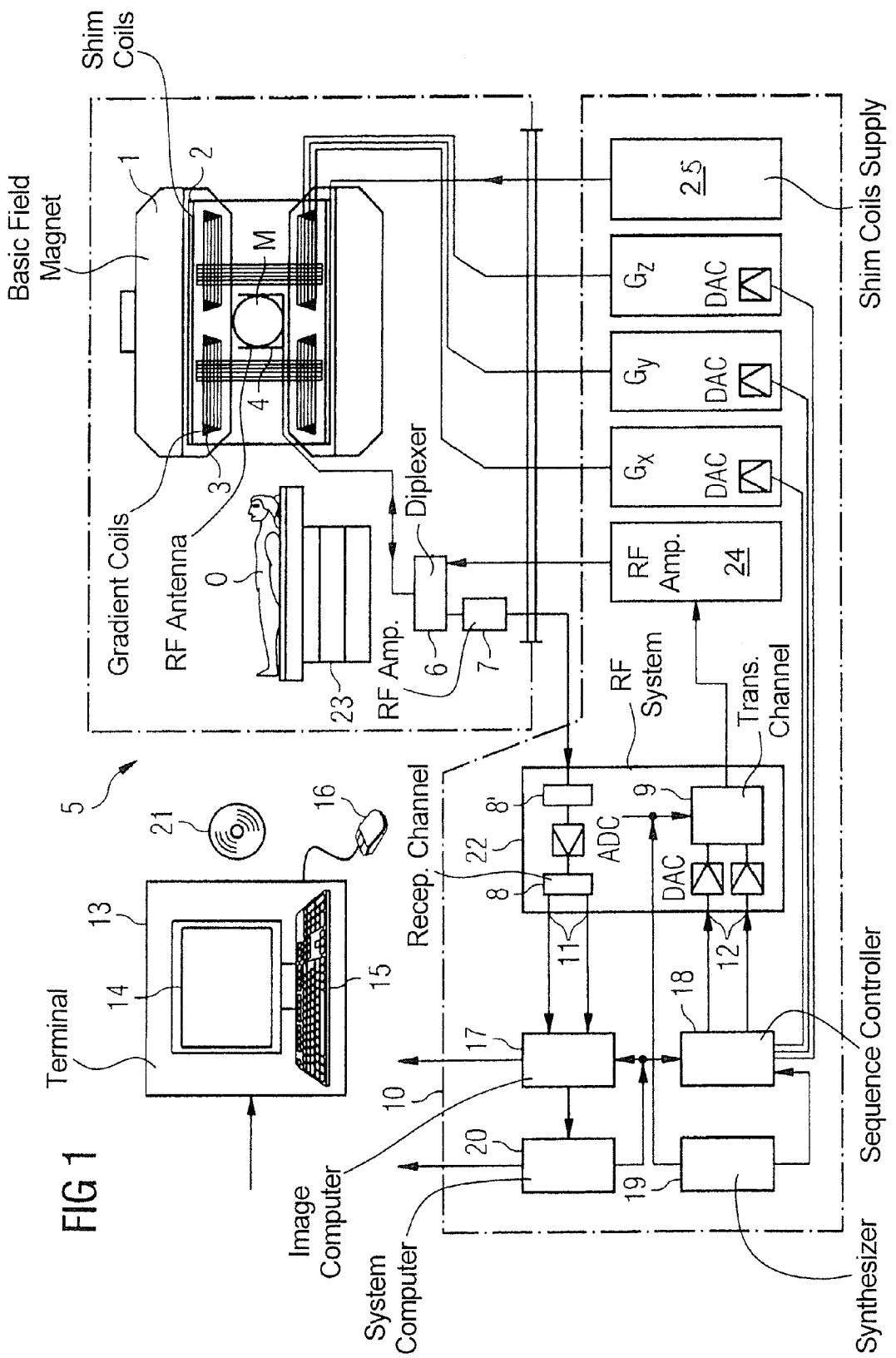
FIG. 1 schematically illustrates a magnetic resonance imaging apparatus constructed and operating in accordance with the present invention.

FIG. 1 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject U, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 25 for the shim-coils 2.

A cylindrically shaped gradient coil system 3 is incorporated in the basic field magnets 1, composed of three windings. Each winding is supplied by a corresponding amplifier with power for generating a linear gradient field in a respective axis of a Cartesian coordinate system. The first partial winding of the gradient field system 3 generates a gradient $G_x$ in the x-axis, the second partial winding generates a gradient $G_y$ in the y-axis, and the third partial winding generates a gradient $G_z$ in the z-axis. Each of these amplifiers has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier 24 into a magnetic alternating field for the excitation of the nucleii by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via the amplifier 24.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, that includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

In FIG. 1, the components encompassed (built into) the basic field magnet 1, into which the patient 0 is moved, form a magnetic resonance scanner, which is operated by the multiple computers and processors that are also shown in FIG. 1. These computers and processors shown in FIG. 1 are programmed individually or collectively to execute the method according to the invention.

Figure 2:
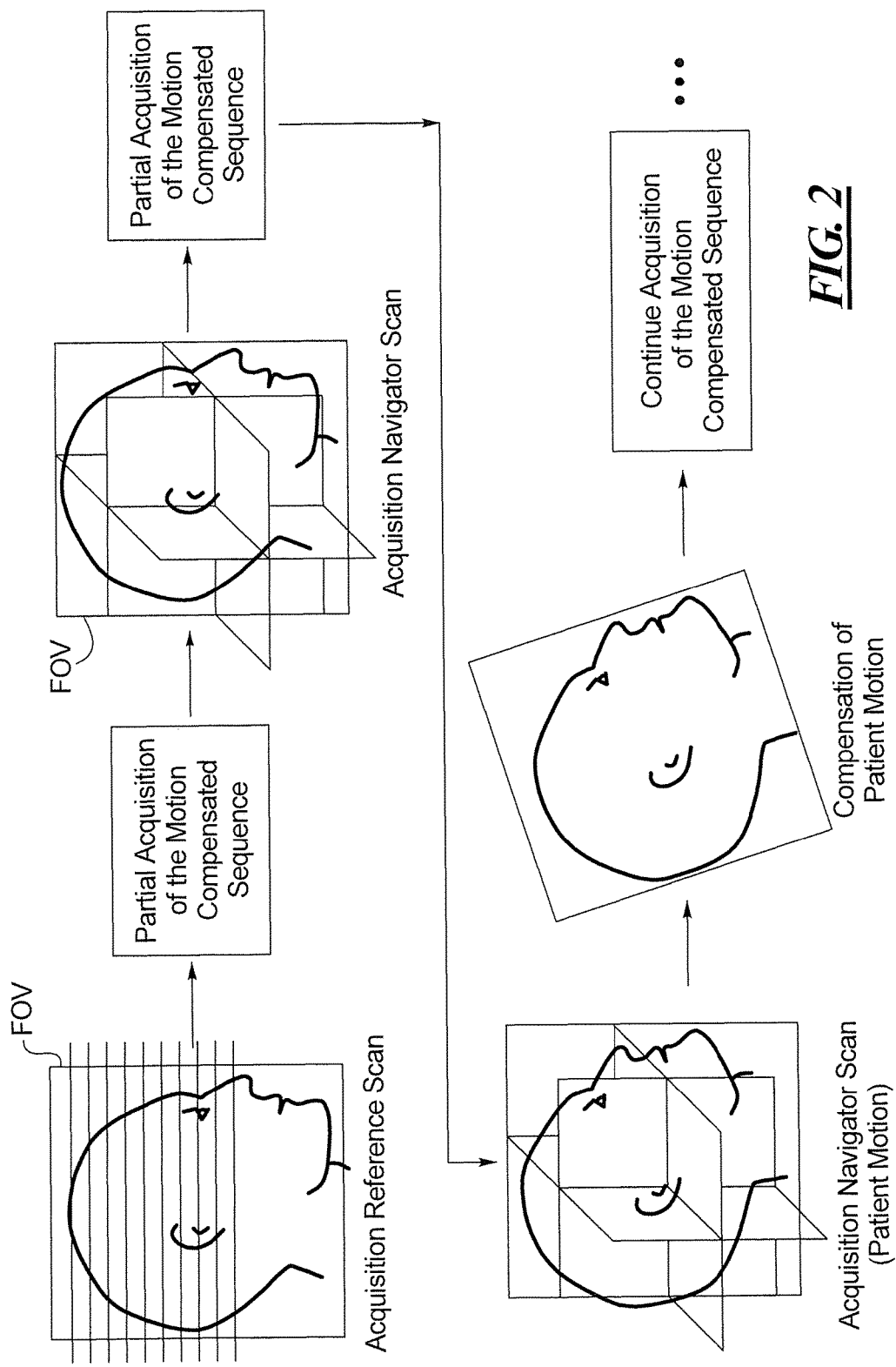
FIG. 2 is a flowchart that schematically illustrates the basic steps in the prospective motion-correction sequence, with acquisition of navigator sub-volumes, in accordance with the present invention.

The basic steps of the motion-compensated sequence in accordance with the present invention are shown in FIG. 2. This begins with the acquisition of a reference scan, such as by obtaining multiple slices of an acquisition volume of an examination subject, in this case the upper head of the subject. Once this acquisition volume has been defined, as the sequence field of view (FOV), the magnetic resonance scanner is operated to begin the acquisition of diagnostic image data according to the motion-correction sequence. After a portion of this diagnostic data have been acquired, a navigator scan is executed, wherein navigator data are acquired only from a sub-volume of the acquisition volume. The acquired navigator data from the sub-volume are then compared with the data represented in the reference scan, in order to determine whether motion of the patient has occurred between the acquisition of the reference scan and the acquisition of the sub-volume navigator data. In the motion correction algorithm that is employed in accordance with the present invention, only image elements (voxels) of the reference scan data are compared with the navigator data represented by the sub-volumes. Since the acquired navigator data constitutes only a sub-volume in total of the overall acquisition volume, the comparison, and thus the execution of the motion-correction algorithm, requires less computer capacity, and can be executed more quickly.

Each navigator sub-volume can be acquired with a simultaneous multi-slice (SMS) blipped CAIPI acceleration method. The in-plane resolution of each navigator sub-volume is independent of the resolution of the motion-corrected base sequence. Typically, the navigator resolution is lower than the image data resolution, in order to further accelerate the acquisition and the motion-detection algorithm execution.

The intersection of the navigator planes does not necessarily have to coincide with the center point of the FOV (acquisition volume) of the data acquisition sequence.

Although the navigator planes are shown in the embodiment of FIG. 2 as being orthogonal, they do not necessarily have to be orthogonal. The primary consideration in defining the navigator sub-volumes is to cause the sub-volumes to collectively encompass a total volume, that is less than the diagnostic image data acquisition volume, but that is very likely to "capture" relevant patient motion that occurs during the acquisition of the image data. Orthogonal orientation of the sub-volume navigators results in a high spatial resolution at the intersecting regions, and simultaneously reduces the amount of image data significantly that are necessary for comparison in the motion-correction algorithm.

The reference scan in the exemplary embodiment shown in FIG. 2 is a full-resolution, isotropic volume that covers the box encompassed by all three of the orthogonal sub-volume navigators. The actual motion detection algorithm can be any rigid-body motion detection algorithm, such as the Gauss-Newton based method described in the aforementioned article by Thesen et al. In contrast to the conventional procedure, only image elements of the acquisition volume that are defined by (correspond to) the sub-volume navigators are considered for detecting the motion that is then used in the motion-correction algorithm. All remaining voxels of the reference scan, which do not coincide with the sub-volume navigators, are not considered.

Additional anatomical background information can be used to define the navigator sub-volumes. It is common, before starting the diagnostic scan, to acquire a localizer image of the subject, that is typically an overview image of the relevant anatomy of the subject, and is used to support planning of the diagnostic imaging sequence, such as defining the acquisition field of view. This localizer image can be processed automatically by known techniques in order to detect the relevant anatomy and to calculate the position of anatomical landmarks without user interaction. This anatomical information also is very useful for the definition of the sub-volume navigators, in terms of their positioning and coverage. It is desirable to plan the location of the sub-volume navigators in an anatomical region that cannot be moved non-rigidly by the patient, as noted above.

In the embodiment of the flowchart shown in FIG. 2, after the first navigator scan acquisition, it is determined that no significant change in the position of the relevant anatomy of the patient has occurred, and therefore the image data (diagnostic) acquisition sequence proceeds, with the acquisition of another portion of the image data. A navigator scan is then again implemented, in the same manner as described earlier. In the embodiment shown in FIG. 2, the result of this navigator scan is a determine that patient motion has occurred between the time that the first portion of the image data were acquired and the time during which the second portion of the image data was acquired. As schematically illustrated in FIG. 2, this results in the motion-correction algorithm compensating for the patient motion. This results in a motion-correction instruction, such as an adjustment of the imaging field of view, being provided to the control computer that operates the magnetic resonance scanner. This adjusted sequence is then used to acquire another portion of the diagnostic image data, and this procedure is repeated until all of the desired diagnostic image data have been acquired.

Figure 3:
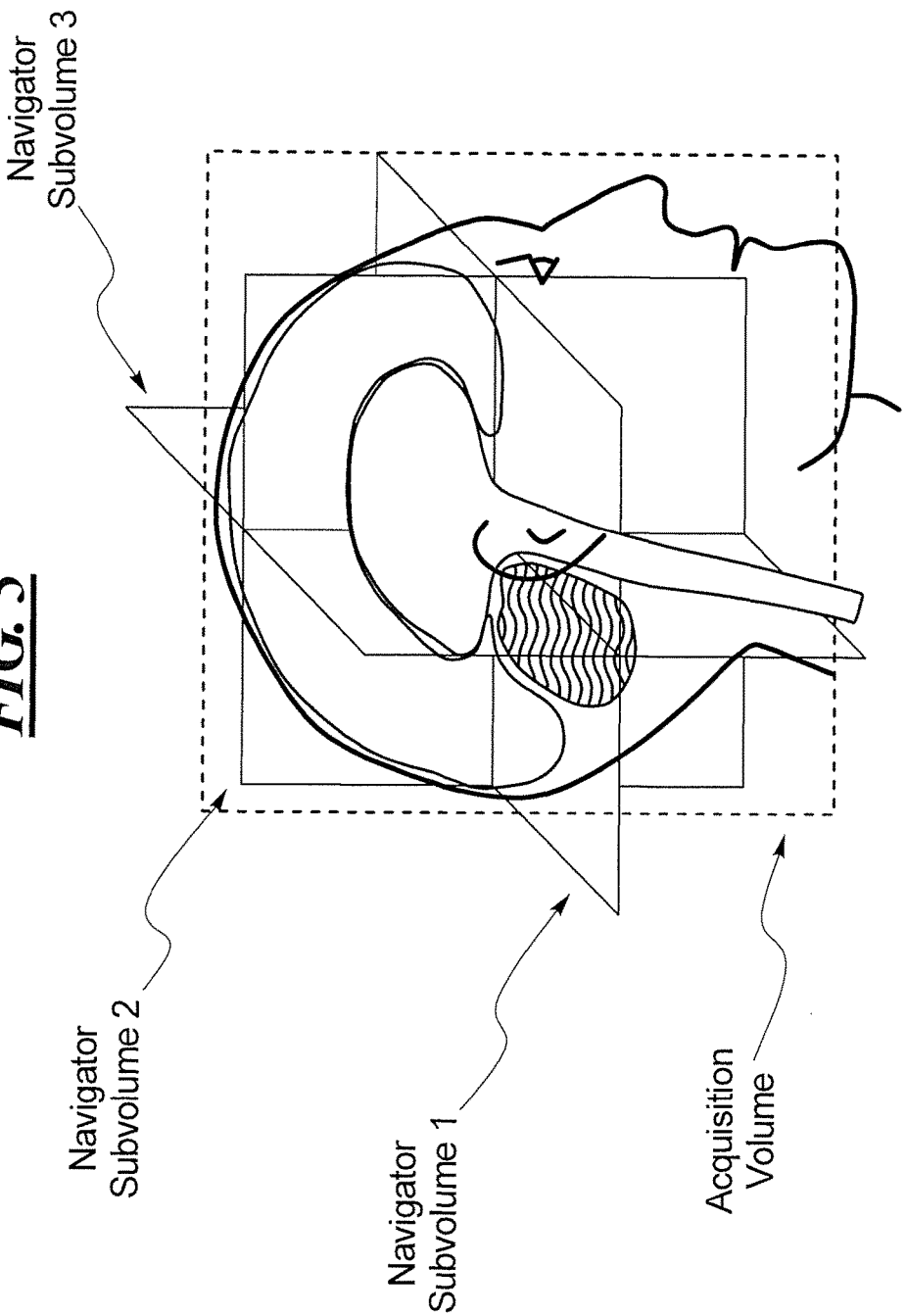
FIG. 3 schematically illustrates a first embodiment for defining the navigator sub-volumes in accordance with the present invention.

One embodiment for defining the navigator sub-volumes is shown in FIG. 3, wherein each sub-volume consists of a single slice. Another embodiment is shown in FIG. 4, wherein each navigator sub-volume is composed of three slices. An appropriate number of slices for each navigator sub-volume can be selected in the planning stage, while taking into account that acquiring more slices in each navigator volume increases the navigator data acquisition time, and also increases the computation time for executing the motion-correction algorithm.

The acquisition and use for motion correction of navigator sub-volumes in accordance with the present invention has a number of advantages. As noted above, this results in a reduced scan time for the navigator data acquisition, compared to the conventional sequential acquisition of 2D navigator slices that encompass substantially the entire acquisition volume. As noted above, the scan time for the sub-volume navigators is implemented very quickly, by the use of SMS with CAIPI.

The simultaneous multi-slice acquisition of the imaging data is especially beneficial for navigator images, because all simultaneously excited slices are automatically consistent, due to the simultaneous acquisition of multiple slices. In conventional 2D image-based navigator acquisition, wherein all slices are acquired sequentially, the patient may move during the sequential acquisition. This motion during the navigator scan in a conventional sequence can result in a violation of the assumption of a rigid-body motion that was made for the model that is used in the motion-detection algorithm in conventional procedures.

Moreover, the spacing between simultaneously acquired slices in accordance with the invention is inherently maximized, due to SMS, in order to provide the best possible separation of these slices. In the context of motion detection, this is especially beneficial so as to achieve robust results.

The reduced image data that are used for identifying the motion in the motion-correction algorithm reduces the computational load and accelerates the motion detection. This is particularly relevant because the regions of the acquisition volume that are not covered by the sub-volume navigators tend to be less useful for motion detection, and therefore the non-use of those regions in the motion-correction algorithm does not significantly degrade the motion-correction accuracy.

The embodiment wherein orthogonal sub-volume navigators are used provides high in-plane resolution. In the overlapping region of the sub-volume navigators, the effective image resolution is significantly higher compared to the non-overlapping regions of conventional navigators. This is particularly beneficial when used in combination with the aforementioned anatomical background information. Because this overlapping section can be placed independently of the field of view of the base sequence (i.e., the acquisition region), non-rigid motion and image artifacts resulting therefrom can be minimized, which lead to significantly increased robustness.

The use of EPI-based image navigators, as is conventional, to detect motion is susceptible to image distortions related to drift and inhomogeneity of the basic magnetic field (B0 field). If a single volume of EPI navigators is used, artifacts resulting from those factors may be manifest in a specific direction (usually the phase encoding direction), thereby making the motion detection less reliable in that direction. The use of orthogonal sub-volumes in accordance with the invention spreads these artifacts into different directions, and thereby minimizes their impact on the overall motion detection.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for prospective motion correction in magnetic resonance (MR) imaging, comprising:
   (a) providing a motion-correction processor with data representing an MR reference scan of an acquisition volume in a subject, from which MR diagnostic data are to be acquired in a subsequently conducted diagnostic scan of the subject, said subject, in said diagnostic scan, exhibiting movement;
   (b) from a control computer, operating an MR scanner, while the subject is situated therein, to execute said diagnostic scan by acquiring MR data in respective portions from the acquisition volume of the subject;
   (c) during said diagnostic scan, after acquiring a portion of said MR data, operating said MR scanner to simultaneously acquire navigator data only from multiple slices of the subject in respective sub-volumes, said sub-volumes in total encompassing a volume that is less than said acquisition volume;
   (d) before acquiring another portion of said MR data in said diagnostic scan, providing said navigator data acquired from said sub-volumes to said motion-correction processor and, in said motion-correction processor, executing a motion-correction algorithm wherein only data in said data representing said MR reference scan that correspond to said sub-volumes are compared with said navigator data acquired from said sub-volumes, to identify said movement of said subject that occurred between a time at which acquisition of said portion of said MR data was started and a time at which said navigator data were acquired from said sub-volumes, and generating a motion-compensation instruction, dependent on the identified movement, and providing said motion-correction instruction to said control computer;
   (e) from said control computer, adjusting operation of said MR scanner, dependent on said motion-correction instruction, to acquire another portion of said MR data in said diagnostic scan;
   (f) repeating (c), (d) and (e) until all of said MR data have been acquired from the acquisition volume of the subject in said diagnostic scan; and
   (g) in said motion-correction processor, generating a motion-corrected MR image of the acquisition volume of the subject from said MR data acquired in said diagnostic scan, and making the MR image available in electronic form as a data file from said motion-correction processor.

2. A method as claimed in claim 1 comprising defining said slices of said respective navigator volumes to be orthogonal.

3. A method as claimed in claim 2 comprising defining one slice for acquiring said navigator data in each orthogonal navigator sub-volume.

4. A method as claimed in claim 2 comprising defining three slices from which said navigator data are acquired in three orthogonal sub-volumes.

5. A method as claimed in claim 2 wherein said acquisition volume has a center, and wherein said orthogonal navigator sub-volumes intersect each other in a region that encompasses said center.

6. A method as claimed in claim 1 comprising employing a Gauss-Newton based method as said motion-correction algorithm.

7. A method as claimed in claim 1 comprising operating said MR scanner, before said diagnostic scan, to acquire a localizer MR image of the subject and, in said control computer, using anatomy of the subject represented in said localizer image to determine said navigator sub-volumes.

8. A method as claimed in claim 1 comprising acquiring said slices of said navigator sub-volumes by operating said MR scanner with a simultaneous multi-slice blipped CAIPI method.

9. An apparatus for prospective motion correction in magnetic resonance (MR) imaging, comprising:
an MR scanner;
a motion-correction processor provided with data representing an MR reference scan of an acquisition volume in a subject, from which MR diagnostic data are to be acquired in a subsequently conducted diagnostic scan of the subject, said subject, in said diagnostic scan, exhibiting movement;
a control computer configured to operate the MR scanner, while the subject is situated therein, to execute said diagnostic scan by acquiring MR data in respective portions from the acquisition volume of the subject;
said control computer being configured to, (a) after a portion of said MR data is acquired, operate said MR scanner during said diagnostic scan simultaneously acquire navigator data only from multiple slices of the subject in respective sub-volumes, said sub-volumes in total encompassing a volume that is less than said acquisition volume;
said control computer being configured to (b) before acquiring another portion of said MR data in said diagnostic scan, provide said navigator data acquired from said sub-volumes to said motion-correction processor and, said motion-correction processor, being configured to execute a motion-correction algorithm wherein only data in said data representing said MR reference scan that correspond to said sub-volumes are compared with said navigator data acquired from said sub-volumes, to identify said movement of said subject that occurred between a time at which acquisition of said portion of said MR data was started and a time at which said navigator data were acquired from said sub-volumes, and generate a motion-compensation instruction, dependent on the identified movement, and provide said motion-correction instruction to said control computer;
said control computer being configured to (c) adjust operation of said MR scanner, dependent on said motion-correction instruction, to acquire another portion of said MR data in said diagnostic scan;
said control computer and said motion compensation processor being configured to repeat (a), (b) and (c) until all of said MR data have been acquired from the acquisition volume of the subject in said diagnostic scan; and
said motion-correction processor being configured to generate a motion-corrected MR image of the acquisition volume of the subject from said MR data acquired in said diagnostic scan, and to make the MR image available in electronic form as a data file from said motion-correction processor.

10. An apparatus as claimed in claim 9 wherein said control computer is configured to define said slices of said respective navigator volumes to be orthogonal.

11. An apparatus as claimed in claim 9 wherein said control computer is configured to define one slice for acquiring said navigator data in each orthogonal navigator sub-volume.

12. An apparatus as claimed in claim 9 wherein said control computer is configured to define three slices from which said navigator data are acquired in three orthogonal sub-volumes.

13. An apparatus as claimed in claim 9 wherein said acquisition volume has a center, and wherein said control computer is configured to define said orthogonal navigator sub-volumes to intersect each other in a region that encompasses said center.

14. An apparatus as claimed in claim 9 wherein said motion-correction processor is configured to employ a Gauss-Newton based method as said motion-correction algorithm.

15. An apparatus as claimed in claim 9 wherein said control computer is configured to operate said MR scanner, before said diagnostic scan, to acquire a localizer MR image of the subject and to use anatomy of the subject represented in said localizer image to determine said navigator sub-volumes.

16. An apparatus as claimed in claim 9 wherein said control computer is configured to operate the MR scanner to acquire said slices of said navigator sub-volumes with a simultaneous multi-slice blipped CAIPI method.

17. A non-transitory, computer-readable data storage medium encoded with programming instructions, said storage medium being loaded into a motion-correction and control computer of a magnetic resonance (MR) apparatus, said MR apparatus also comprising an MR scanner, and said programming instructions causing said motion-correction and control computer system to:
(a) receive a motion-correction processor with data representing an MR reference scan of an acquisition volume in a subject, from which MR diagnostic data are to be acquired in a subsequently conducted diagnostic scan of the subject, said subject, in said diagnostic scan, exhibiting movement;
(b) operate the MR scanner, while the subject is situated therein, to execute said diagnostic scan by acquiring MR data in respective portions from the acquisition volume of the subject;
(c) during said diagnostic scan, after acquiring a portion of said MR data, operate said MR scanner to simultaneously acquire navigator data only from multiple slices of the subject in respective sub-volumes, said sub-volumes in total encompassing a volume that is less than said acquisition volume;
(d) before acquiring another portion of said MR data in said diagnostic scan, execute a motion-correction algorithm wherein only data in said data representing said MR reference scan that correspond to said sub-volumes are compared with said navigator data acquired from said sub-volumes, to identify said movement of said subject that occurred between a time at which acquisition of said portion of said MR data was started and a time at which said navigator data were acquired from said sub-volumes, and generate a motion-compensation instruction, dependent on the identified movement;
(e) adjust operation of said MR scanner, dependent on said motion-correction instruction, to acquire another portion of said MR data in said diagnostic scan;
(f) repeat (c), (d) and (e) until all of said MR data have been acquired from the acquisition volume of the subject in said diagnostic scan; and (g) generate a motion-corrected MR image of the acquisition volume of the subject from said MR data acquired in said diagnostic scan, and make the MR image available in electronic form as a data file from said computer.

\* \* \* \* \*